United States Patent [19]

Attey et al.

[11] Patent Number: 5,544,487
[45] Date of Patent: Aug. 13, 1996

[54] THERMOELECTRIC HEAT PUMP W/HOT & COLD LIQUID HEAT EXCHANGE CIRCUTIS

[75] Inventors: Graeme S. Attey; Jesse H. Searls; Gary L. Sargeant, all of Fremantle, Australia

[73] Assignee: Hydrocool Pty Ltd, Fremantle, Australia

[21] Appl. No.: 84,271

[22] PCT Filed: Jan. 10, 1992

[86] PCT No.: PCT/AU92/00008

§ 371 Date: Jul. 7, 1993

§ 102(e) Date: Jul. 7, 1993

[87] PCT Pub. No.: WO92/13243

PCT Pub. Date: Aug. 6, 1992

[30] Foreign Application Priority Data

Jan. 15, 1991 [AU] Australia ................. PK4212

[51] Int. Cl.⁶ ................................................. F25B 21/02
[52] U.S. Cl. ..................... 62/3.7; 62/3.3; 62/3.2; 165/170
[58] Field of Search ................... 62/3.2, 3.3, 3.7; 165/44, 88.4, 170

[56] References Cited

U.S. PATENT DOCUMENTS 3,111,813 11/1963 Blumentritt et al. .
3,295,667 9/1965 Frantti .................................. 62/3.3
3,481,393 12/1969 Chu ..................................... 62/3.7
4,109,707 8/1978 Wilson et al. ....................... 165/46
4,829,771 5/1989 Koslow et al. .
5,154,661 10/1992 Higgins ............................... 62/3.3

FOREIGN PATENT DOCUMENTS

| 267755 | 1/1963 | Australia . |
| 5473 | 5/1966 | Australia . |
| 0043162 | 1/1982 | European Pat. Off. . |
| 1299540 | 12/1962 | France . |
| 868029 | 5/1961 | United Kingdom . |
| 2159002 | 11/1985 | United Kingdom . |

*Primary Examiner*—John M. Sollecito
*Attorney, Agent, or Firm*—Bliss McGlynn, P.C.

[57] ABSTRACT

A thermoelectric system (10) includes a thermoelectric module (12) and volume defining manifolds (14) attached to opposed faces of the module (12). Fluid pumps (44) circulate fluid from remote heat exchangers (46) and through the manifolds (14). The module (12) provides opposing hot and cold faces with respective manifolds (14) attached thereto. The cold faces and manifolds (14) are connected to a first fluid pump (44) and heat exchanger (46), and the hot faces and manifolds (14) are connected to a second fluid pump (44) and heat exchanger (46). The manifolds (14) include an outer wall spaced from the module (12) and side walls abutting the respective faces thereby defining an open face wherein the side walls and outer wall and outer face define a volume for receiving fluid.

24 Claims, 4 Drawing Sheets

THERMOELECTRIC HEAT PUMP W/HOT & COLD LIQUID HEAT EXCHANGE CIRCUTIS

DESCRIPTION

The present invention relates to thermoelectric refrigeration systems.

FIELD OF THE INVENTION

It is known to use thermoelectric modules in refrigeration systems. A thermoelectric module is a known type of heat pump in which the passage of an electric current through the module causes one side of the module to be cooled and the opposite side of the module to be heated. Thermoelectric modules are also known as Peltier modules or thermoelectric heat pumps.

Previously known refrigeration units containing thermoelectric modules have comprised aluminium heat sinks which are clamped tightly to each side of the thermoelectric module, creating a thermoelectric assembly. When an electric current is applied to the module, heat is pumped from one side to the other side. Initially, when a current is first applied to the thermoelectric module the temperature differential between the two side is at a minimum. Under these conditions the thermoelectric assembly offers efficient performance. However, as the refrigerator approaches its desired internal temperature here is an increased temperature difference between the two sides. Under these conditions the thermoelectric assembly becomes less efficient as a heat pump. When the thermoelectric module is configured as a heat pump a conventional thermoelectric assembly must always have an electric current applied to it in order maintain a temperature differential across the device. If this current is removed then heat will flow through the assembly in such a manner as to re-establish thermal equilibrium. Therefore, in practice, conventional thermoelectric assemblies consume power simply to maintain a temperature difference across the assembly. This is very wasteful of energy.

In practice, conventional thermoelectric assemblies also suffer from the effects of thermal impedances which occur at the boundaries of the thermoelectric module and the heat sinks. This requires great care and expense in the manufacture of thermoelectric assemblies to ensure the minimisation of these boundary effects.

Some thermoelectric assemblies have two small thermoelectric modules sandwiched between heat sinks rather than a single thermoelectric module in an effort to try and increase the surface area contact with the heat sinks. However, the structural and design limitations of thermoelectric modules forced on them by the clamping forces of solid heat sinks and cost, restrict the modules themselves to being necessarily small, clearly preventing large-area thermal contact.

Also, for the sac reasons, electrical connectors between P & N thermocouples within thermoelectric modules are very small. This is restrictive as improved performance can be achieved by utilising greater thermal area contact via large thermal connections.

Another major limiting factor in conventional thermoelectric module design is the fact that the hot and cold faces of the modules are close together (usually within 5 mm). There are very significant losses through convection, conduction and radiation from one face to another i.e. high heat transfer. This greatly limits the ultimate performance of the thermoelectric modules. Exacerbating this problem even further in conventional thermoelectric assemblies is the fact that the solid heat sinks attached to the module faces are In close proximity to one another. The thermal mass and close proximity of the two heat sinks in a conventional thermoelectric assembly constantly work against one another. The abovementioned problems have restricted the use of thermoelectric assemblies to very small, portable coolers and refrigerators. Thermoelectric assemblies have hoe been practical for use in domestic refrigeration because of, for example, the high power consumption.

SUMMARY OF THE INVENTION

The present invention provides thermoelectric systems suitable for use in refrigeration in which at least some of the problems of the prior art are alleviated. In accordance with one aspect of the present invention there is provided a thermoelectric system characterised by comprising a thermoelectric module having first and second opposed faces, a manifold defining a volume attached to at least one of the opposed faces, the manifold having an inlet and an outlet and the inlet and the outlet being connected to a heat exchange means, and pump means being provided for circulating fluid between the manifold and the heat exchange means.

In accordance with a further aspect of the present invention there is provided a submersible centrifugal pump comprising a stationary bearing shaft, stationary electrical coil or armature means disposed about the bearing shaft, a rotatable magnet means extending around the electrical coil means, means for supplying electrical power to the coil means, impeller connected to the magnet means and bearing means mounting the magnet means and the impeller on the bearing shaft. In accordance with a yet further aspect of the present invention there is provided a thermoelectric module comprising a row or rows of spaced thermocouples having first and second ends, first and second adjacent thermocouples being electrically and thermally connected at their first ends by a block of electrically and thermally conductive material, second and third adjacent thermocouples being electrically and thermally connected at their second ends by a block of electrically and thermally conductive material, this arrangement being repeated so that there is a continuous electrical path from the first thermocouple in the row to the last, said blocks of electrically and thermally conductive material being exposed so as to be contactable by a heat transfer fluid, in use.

BRIEF DESCRIPTION OF THE DRAWINGS

The present invention will now be described, by way of example, with reference to the accompanying drawings, in which.

DESCRIPTION OF THE INVENTION

Figure 1:
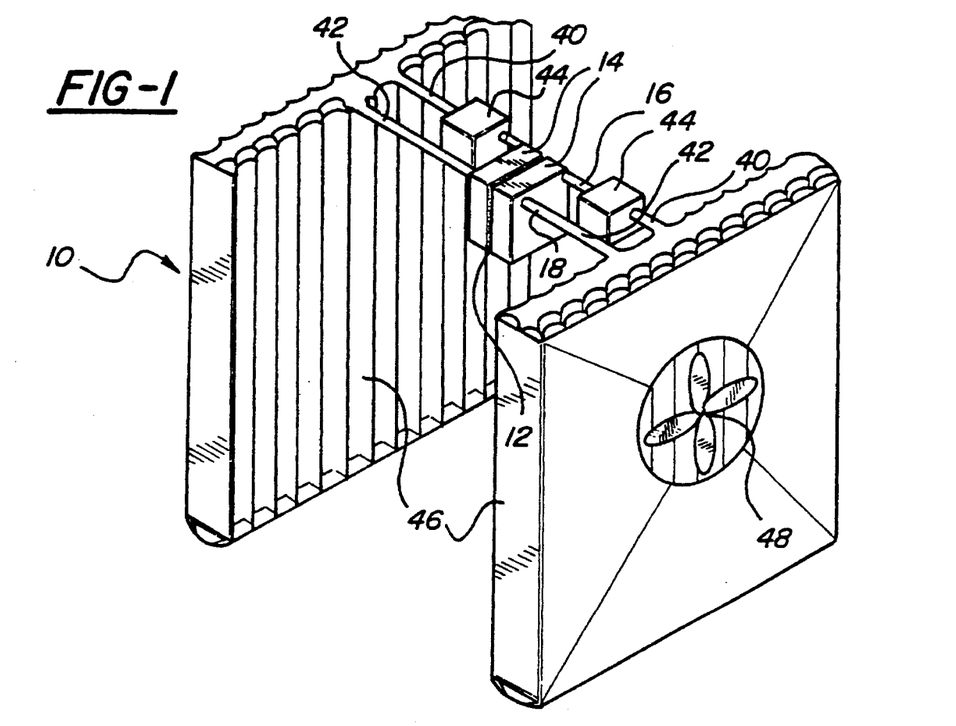
FIG. 1 is a schematic perspective view of one embodiment of a thermoelectric system in accordance with the present invention.

In FIG. 1 of the accompanying drawings there is shown a thermoelectric system 10 comprising a thermoelectric module 12 having first and second opposed faces. A respective manifold 14 defining a volume is attached to each face of the thermoelectric module 12.

Figure 3:
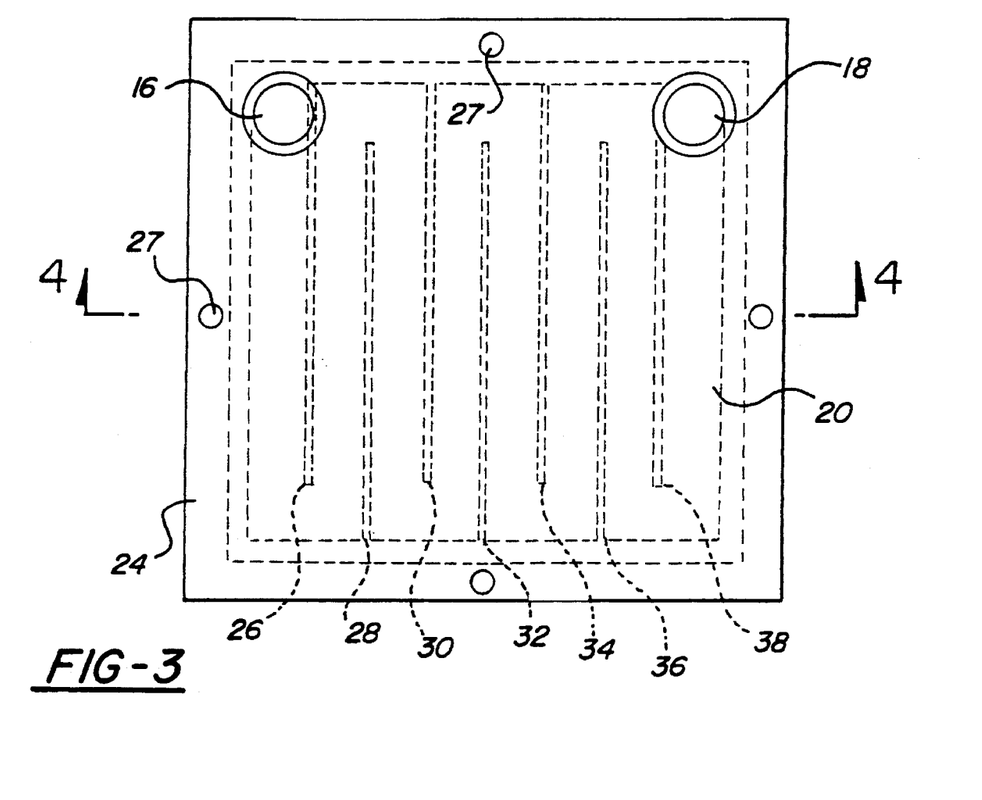
FIG. 3 is a rear view of a thermoelectric module manifold which can be used in the systems of FIGS. 1 and 2.

Each manifold 14 contains an inlet 16 and an outlet 18 as shown in FIG. 3. Further, each manifold 14 contains an elongated labyrinthine, zig-zag, spiral or tortuous passageway 20 extending between the inlet 16 and the outlet 18 as shown in FIG. 3. The elongated nature of the passageway 20 enhances contact of fluid with the thermoelectric module 12.

Figure 4:
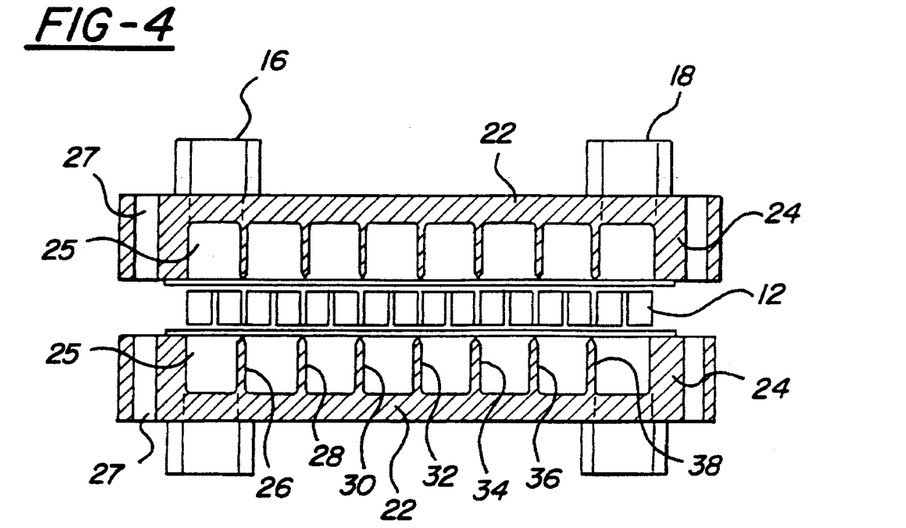
FIG. 4 is a cross section through a thermoelectric module with attached manifolds as shown in FIG. 3, which can be used in the systems of FIGS. 1 and 2.

The passageway 20 is typically formed by a moulded metal or plastics material to provide the manifold 14 with an outer wall 22 parallel to the corresponding face of the thermoelectric module 12 as shown in FIG. 4. The outer wall 22 extending from it a periphery of the wall 24 which extends around the entire periphery of the wall 22. The peripheral wall 24 contains a number of bolt holes 27. The bolt holes 27 allow very small gauge bolts and nuts to hold one manifold 14 to the other manifold 14 on the other side of the thermoelectric module 12. The use of light gauge bolts reduces unwarranted conduction from one side to the other along the bolts.

Within the walls 22 and 24 there is defined, together with the adjacent face of the thermoelectric module 12, a volume 25 containing the passageway 20. The volume 25 has a first partition 26 which extends longitudinally away from the wall 24 at a first end of the volume 25. The first partition 26 extends from a point adjacent the inlet 16 parallel to an adjacent side of the volume 25 partially towards a second end of the volume 25. A second partition 28 is parallel to and spaced from the first partition 26 and extends longitudinally from the wall 24 at a second end of the volume 25 partially towards the first end of the volume 25. This is repeated with a third parallel partition 30 which is similar to the first partition 26 and then 4th, 5th and 6th parallel partitions 32, 34 and 36. Finally, there is a seventh, parallel partition 38 which is similar to the first partition 26 and is located adjacent the outlet 18.

As can be seen in FIG. 4 the partitions 26,28,30,32,34,36 and 38 extend from the wall 22 for the same depth as the peripheral wall 24 and engage with the adjacent face of the thermoelectric module 12 with minimal surface area contact with the face. The repeated changes of direction of the channels defined by the partitions ensure that fluid flow through the passageway 20 is turbulent which increases thermal conduction between the fluid and the module face. The preferred number of zig-zagging, spiralling or tortuous fluid channels across a typical (for example) 40 mm by 40 mm thermoelectric module face has been found by experiment to be approximately eight. Each channel of the passageway 20 is preferably approximately square or half round. Therefore each channel in cross section is close to 5 mm×5 mm. However, in reality the channels are usually slightly under 5 mm due to the thickness of the channel partitions which are preferably kept to the minimum thickness possible. The number of channels and their depth can be varied to optimise system performance, i.e. when the system is optimised, the heat pumping capacity is at its highest for a given pumping volume and given ambient temperature. The optimisation of manifold 14 channels is based on a balance between the hydrodynamic impedance of the fluid path through the system (the manifold 14 usually has the highest fluid impedance in the system) versus the fluid pumping capacity of a pump.

The peripheral walls 24 of the manifolds 14 may be sealed to the outer perimeter of the module 12 faces to prevent fluid leakage using known technique such as gaskets "O" rings or silica/rubber cement.

As shown in FIG. 1, extending from each inlet 16 there is a respective conduit 40 and extending from each outlet 18 there is a respective conduit 42. One or other of the conduits 40 42 has mounted thereto a pump 44 As shown, each pair of inlet and outlet conduits extends to a remote heat exchanger 46. Each heat exchanger 46 if filled with a fluid which is usually a liquid. Each heat exchanger 46 can be provided with a cooling fan 48. It is possible to design the system so as to make the conduits 40,42 so small as no be unnoticeable, if desired.

In operation of the system 10 of FIG. 1, an electrical current (usually direct current but the current can be modified by devices such as proportional current controllers) is applied across the thermoelectric module 12. Simultaneously, the pumps 44 are energised so than liquid commences to be pumped from the heat exchangers 46 through the inlet conduits 40, the manifolds 14, and then through the outlet conduits 42 back no the respective heat exchanger 46. The passage of the electric current through the thermoelectric module 12 causes heat to be pumped from fluid contained in the heat exchanger 46, conduits 40,42 and manifold 14 on one side (inside) to the manifold 14, conduits 40,42 and heat exchanger 46 on another side (outside) so that the refrigerator inside system is cooled and the outside system is heated.

The thermoelectric module 12 may be mounted at a mid-point in a refrigerator wall with the cooling side manifold 14, pump 44, conduits 40,42 and heat exchanger 46 inside of this point and the heating side manifold 14, pump 44, conduits 40,42 and heat exchanger 46 outside of this point. Pumping of liquid through the refrigerator inside system causes heat which is acquired from the interior of the refrigerator via the inside heat exchanger 46 to be carried away from the inside of the refrigerator to the corresponding outside the exchanger 46 from where the heat is dissipated in known manner.

The thermoelectric system 10 can be operated by employing step control and advantage can be made of the intrinsic non-linear thermal properties of thermoelectric modules and whereby they are at the most efficient when there is a minimal temperature differential across the opposed faces of the module 12. Liquid cooling on each side of the thermoelectric module 12 enables the heat to be readily removed to a remote heat exchanger 46 which can maintain a temperature closer to ambient than conventional solid heat sinks.

In this situation the thermoelectric system 10 described of the present invention can be cycled off when the inside of the refrigerator is at a desired temperature. At this point the fans 48 can be energized so as to bring the outside radiator to a cooler temperature and the inside to a higher temperature (due to the faster absorption of heat from the refrigerator load into the inside heat exchanger) which results in relatively closer inside and outside temperatures (lower temperature differential). Thus, when the thermoelectric system 10 is next re-energised the manifolds 14, pumps 44 and heat exchangers 46 on each side of the thermoelectric module 12 are at a relatively closer temperature differential of the heat transfer fluids and the module 12 itself is closer to a more efficient operating condition.

The ability to cease operation (switch off or cycle off) of the thermoelectric system 10 when the refrigerator achieves a desired inside temperature is enhanced by the fact that the manifolds 14 preferably have small cross-sectional area and small thermal mass and the volume 25 have labyrinthine passageways 20 for fluid flow.

Further, the labyrinthine passageway 20 described above along which the liquid must flow makes it difficult for convection currents to be set up in the liquid after the system 10 has the current removed. Further, when the thermoelectric module 12 is turned off the pumps 44 are also turned off simultaneously so avoiding additional fluid pumping, thereby creating a heat switch or thermal switch effect. Further, the liquid itself is typically a poor conductor of heat, assisting in the heat switch effect, i.e. very little heat transfer takes place from one side of the system to the other side when the module 12 and pumps 44 have their current supply removed.

The liquid or fluid in the system 10 can be typically water on the refrigerator outside and water/glycol, kerosene or methanol on the refrigerator inside. The chemical used on the inside should preferably have high specific heat, low viscosity and ability not to freeze over the thermoelectric module 12 face.

Figure 2:
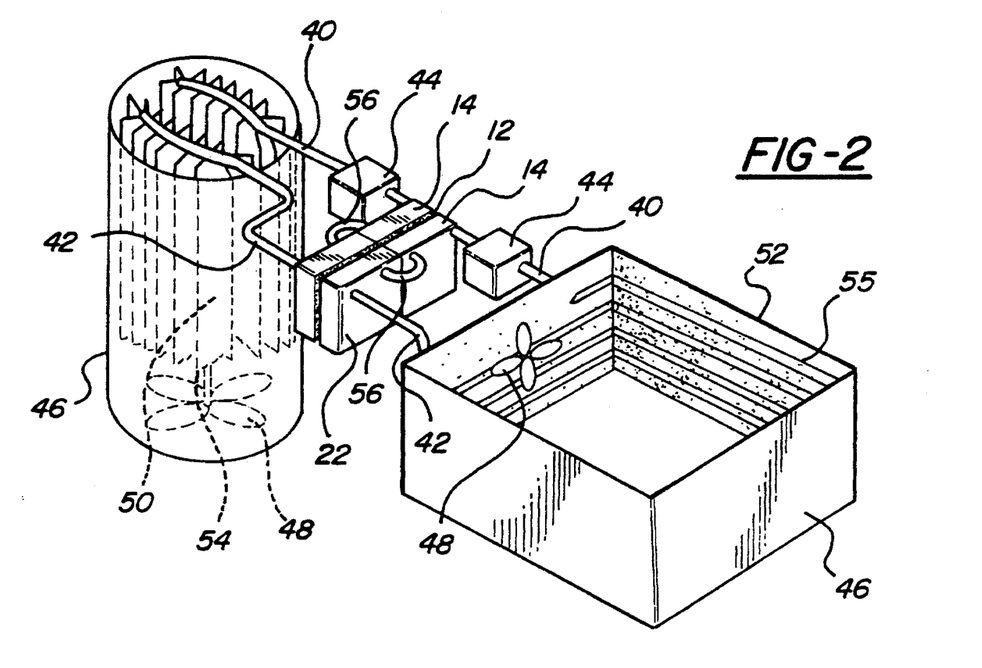
FIG. 2 is a schematic perspective view of a further embodiment of a thermoelectric system in accordance with the present invention.

In the embodiment of FIG. 2, like reference numerals denote like parts to those found in FIG. 1. The thermoelectric system is the same in principle except that one of the heat exchangers 46 is in a tubular enclosure with inside fluid paths surrounded by cooling fins 50 and the other is a pressed metal type 52 which can form a refrigerator wall. In the first, the cooling fan 48 is located adjacent lower ends 54 of the cooling fins 50 and is arranged to rotate about an axis which is aligned with the cooling fins 50 so as to cause air to flow past the cooling fins 50 which causes loss of heat from the cooling fins 50. It is preferable that the flow of air from the fans should be opposite the direction of the flow of the fluid inside the cooling fins 50 so as to maximise efficiency and to create contra low heat exchangers. In the second pressed type 52, a fan 48 may exist air one end of the refrigerator and circulate air around the inside of the refrigerator. As can be seen in FIG. 2, the heat exchanger 52 contains an elongated tube 55 which spirals around the walls of the heat exchanger from the conduit 42 to the conduit 40 or vice versa. Heat is absorbed into the heat exchanger walls and is collected by the fluid in the tube 55 and transported to the module face and eventually dissipated through the heat exchanger on the outside. It has been found that systems with two sets of thermoelectric modules 12 and attached manifolds 14 offer several advantages. For the same volume of fluid flow, a much higher heat pumping capacity can be attained. Also, run in electrical series the twin module system offers excellent efficiency with high heat pumping capacity and low energy drain. Electronics can be provided to switch the modules between series and parallel to achieve optimum performance for given conditions. Series operation uses relatively low power and is efficient in normal operating conditions whereas parallel operation uses relatively high power but is only necessary where it is desired to have low inside refrigerator temperature in high ambient temperature conditions.

A twin module system is shown in FIG. 2 in which the outlet of each manifold 14 is connected to the inlet of each contiguous manifold 14 by a tube 56.

Figure 5:
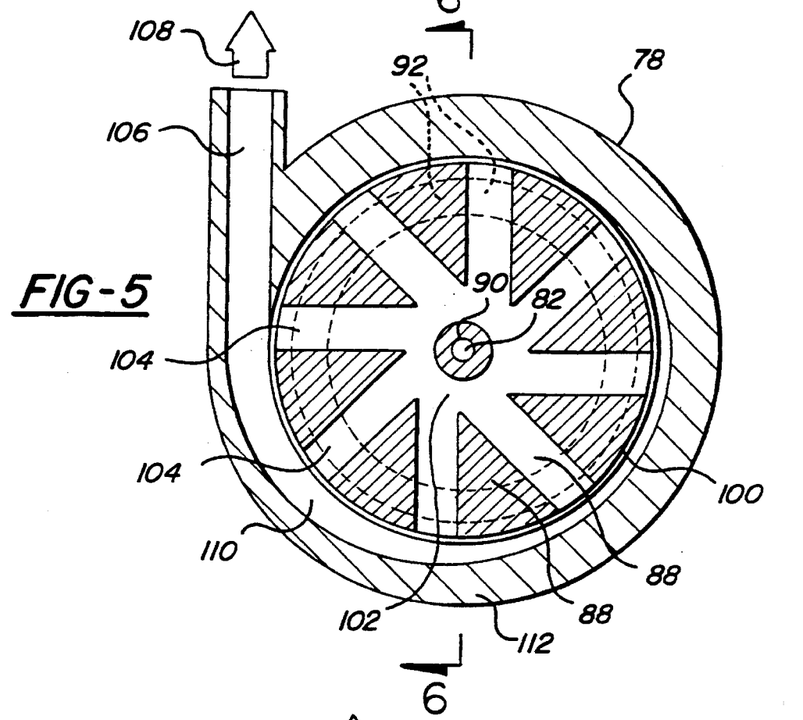
FIG. 5 is a front cross-sectional elevation of an embodiment of a submersible pump which can be used in the systems of FIGS. 1 and 2.
Figure 6:
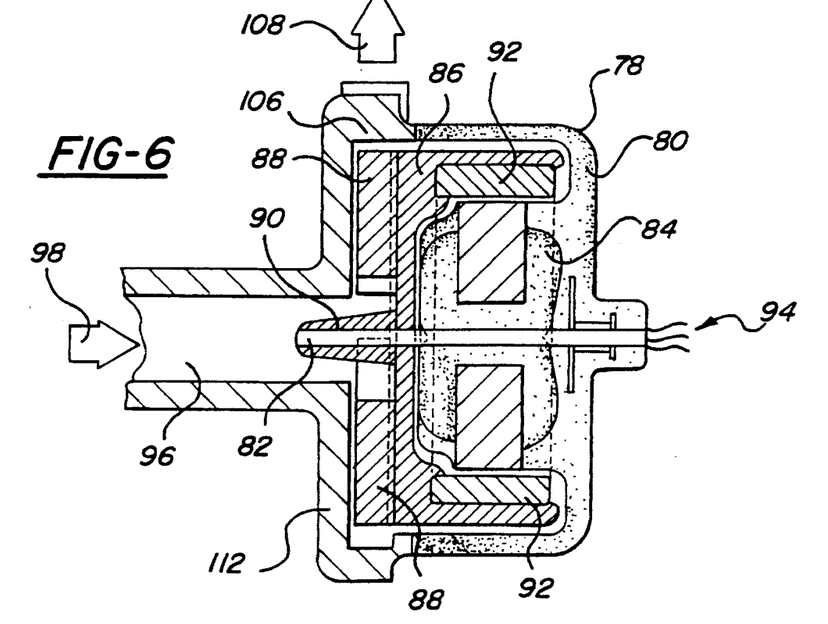
FIG. 6 is a side cross sectional elevation of the submersible pump shown in FIG. 5.

The pumps 44 used in the present invention to circulate the fluid can take many forms. However, a novel type of brushless, submersible, centrifugal pump which has been found to be particularly effective is illustrated in FIGS. 5 and 6. The pump 78 is illustrated in FIGS. 5 and 6 comprises a rear casing 80 and a bearing shaft 82 mounted to a wall of the rear casing 80. A number of electrical coils 84 are disposed about the bearing shaft 82 and neither shaft 82 nor coils 84 are arranged to rotate but are fixed relative to the rear casing 80.

The pump 78 further comprises a magnet housing 86 and a moulded impeller 88 and a bearing 90. The magnetic housing 86 impeller 88 and bearing 90 are preferably formed from one part by moulding or machining. A circular magnet 92 (or plurality of spaced magnets arranged in a circle) is mounted in the magnet housing 86 outwardly of the coils. Electrical wires 94 extend through the rear casing 80 in sealed manner and are connected to the coils 84. The electrical wires 94 connect coils 84 to a see of electronics which energise the coils 84 in such a manner as to cause the impeller 88 and the magnet 92 to rotate around the coils 84 in known manner. To facilitate this, the impeller 88 and the magnet housing 86 are provided with the bearing 90 which is arranged for rotation around the stationary bearing shaft 82. In this realisation the bearing 90 is the sole load bearing mounting for the impeller 88 and the magnet housing 86. In operation, liquid is located in an inlet conduit 96 partly formed by a front outer casing 112. Energisation of the coils 84 causes rotation of the magnet 92 around the coils 84 and thus rotation of the impeller 88. I this way, the impeller 88 is caused to rotate and this induces the liquid to be displaced sideways in the direction of the arrow 108. Thus, a liquid flow is created in the conduit. A preferred form of impeller 88 is shown in FIG. 5. As shown the impeller 88 comprises a general circular disc 100 which has a centre 102 which is cur away. A plurality of elongated cut outs 104 extend outwardly from the cut away centre 102. Rotation of the impeller 88 shown in FIG. 5 causes liquid to be displaced to an outlet conduit 106 in the direction of the arrow 108 as shown in FIG. 6. Preferably, the outlet conduit 106 has an inner curved portion 110 of progressively increasing cross section towards the outer portion of the conduit 106 in the direction of the curve as can be seen in FIG. 5. This configuration is shown as a scroll pattern outlet sweep. Although it is possible to use an outside motor connected to the coolant system via a sealed shaft, this arrangement is not entirely satisfactory due to the possibility of leaks developing if the seals wear.

The heat exchangers 46 that can be successfully incorporated in the present invention can take many forms. The choice is based on heat exchange capability versus cost. Preferred types include copper automotive types, extruded or pressed sheet aluminium types and assembled types constructed of thin aluminium sheet/foil fins pushed over copper/aluminium tubes.

A particularly successful application of the thermoelectric system of the present invention is to utilise very simple outside heat exchangers which may be no more elaborate than a metal tube, for example, which can be immersed in sea/fresh water. The heat exchanger is then cooled by the body of water which is, in the case of the ocean, an infinite heat exchanger itself. The system is therefore also very efficient for marine applications.

Figure 7:
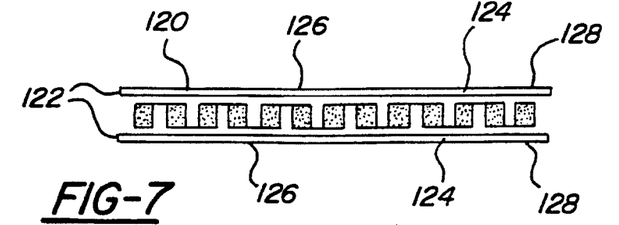
FIG. 7 is a side elevation of a typical conventional thermoelectric module which can be used in the system of FIGS. 1 and 2.

A conventional thermoelectric module 120 which may be used in the present invention is illustrated in FIG. 7. The module 120 comprises a pair of outer, parallel plates 122 which are thermally conductive but electrical insulators. faces. With the plates 122 there is a row of spaced thermocouples 124 The first and second thermocouples 124 at the left as can be seen in FIG. 7 are electrically interconnected by a conductive plate connector 126 at a first end thereof. The second and third thermocouples 124 from the left as seen in FIG. 7 are electrically interconnected by a conductive plate connector 126 at a second end thereof. The alteration of the ends of interconnection of the adjacent thermocouples 124 is repeated across the entire row so that there is an electrically conductive plate across the entire row of connected to the outer plates 122 in heat conductive manner.

Figure 8:
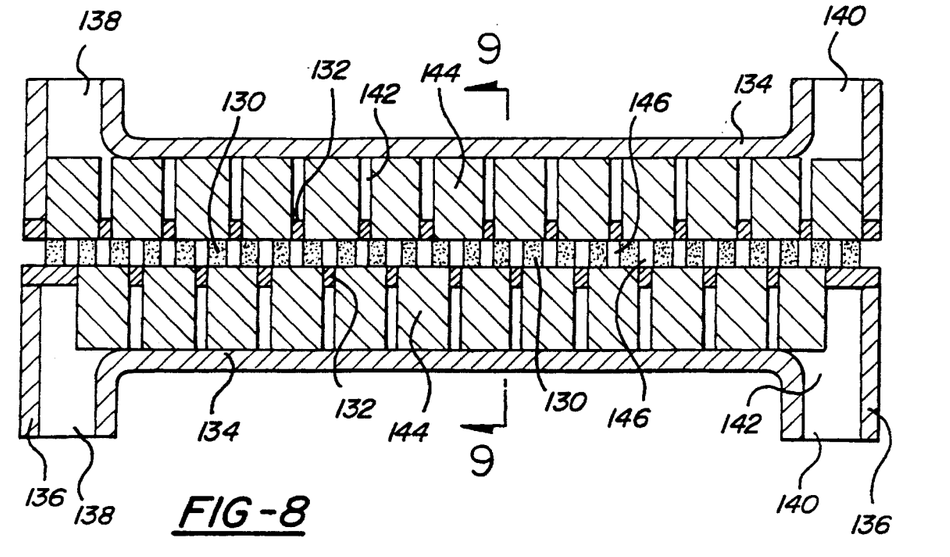
FIG. 8 is a side cross sectional elevation of an embodiment of a novel thermoelectric module which can be used in the systems of FIGS. 1 and 2.
Figure 9:
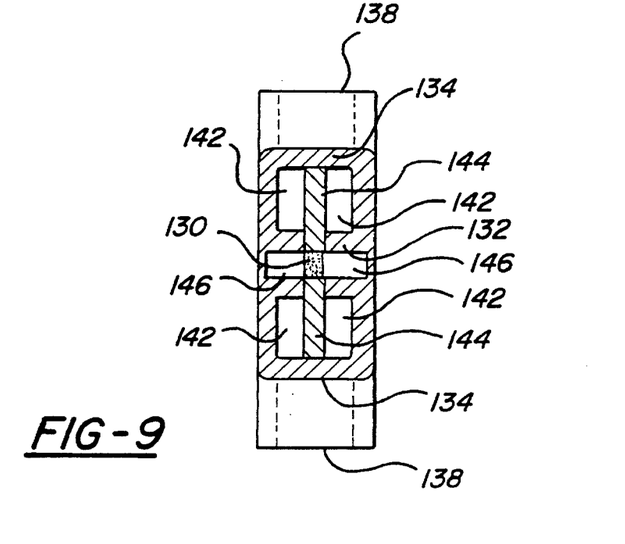
FIG. 9 is an end cross sectional elevation of the thermoelectric module of FIG. 8.

A form of novel thermoelectric module which is particularly efficacious in the context of the present invention is illustrated in FIGS. 8 and 9.

In the embodiment of FIGS. 8 and 9, there is provided a plurality of spaced P and N thermocouples 130 extending in a row. The thermocouple 130 row is located between two housings each having an outer side wall 134 and two end walls 136. Further, each housing contains an inner side wall 132 formed of plastics material and apertured to hold thermocouple connectors in position as will be described.

The walls 132 are kept as thin as possible to minimise coverage of the thermocouple connectors. The side walls 134 are spaced apart from the thermocouple 130 row while the end walls 136 are connected to ends of the thermocouple 130 row. Further, the side walls 134 and end walls 136 define inlet conduits 138, outlet conduits 140 and intermediate coolant passages 142.

As can be seen, the left most thermocouple 130 is connected at a first end by a block of electrically and thermally conductive material 144 such as copper, to the first end of the next adjacent thermocouple 130. The next adjacent thermocouple 130 is connected at a second end by a block of electrically and thermally conductive material 144 to a second end of the next adjacent thermocouple 130 to the right as seen in FIG. 8. This arrangement is repeated right across the thermocouple 130 row. In this way, there is an electrically conductive path across the thermocouple 130 row extending from one end thereof through each electrically conductive block 144 and each thermocouple 130 in turn. Further, as described above each electrically and thermally conductive block 144 is held in position by being located in an aperture in a side wall 132. In known manner, the dissimilar electrically conductive materials of the P and N thermocouples 130 gives rise to the Peltier effect via the junctions or connector blocks 144 when an electric current is applied. This causes beam to be pumped from one side of the thermocouple 130 row to the other.

In the arrangement shown in FIGS. 8 and 9, liquid is always present in the inlets 138, outlets 140 and fluid passageway 142. In accordance with the present invention, when electric current is applied to the thermocouples 130, the pumps 44 are preferably simultaneously energised to cause the liquid to flow across both sides of the thermocouple 130 row.

The liquid is circulated to the remote heat exchangers 46 as described above to transfer heat. The electrically non-conductive liquid directly contacts the electrically conductive blocks 144 so that there are no solid-solid interfaces such as are found between thermoelectric modules and solid heat sinks in prior art devices. This reduces inefficiencies encountered in prior art devices. Between the two walls 132 and surrounding the thermocouples 130 there is a gap 146. This gap or void 146 may be filled with air or foam. More preferably, the gap 146 may be under vacuum or be filled with aerogel. The advantage of the aerogel or vacuum is that they reduce transfer of heat by conduction, convection and radiation between the hot and cold sides of the thermoelectric module.

Most importantly, the advantage of the module shown in FIGS. 8 and 9 over the system otherwise described by this invention but used with conventional thermoelectric modules is that the liquid can flow directly over the enlarged thermocouple connectors 144. The connectors 144 themselves can increase the surface area of thermal contact by up to six times or more over conventional thermoelectric module connectors as shown in FIG. 7. Furthermore, conventional thermoelectric modules have non-electrically conductive faces soldered onto the connectors before the coolant can make contact with the module face. There are significant losses in the solder and ceramic by way of thermal impedance that are avoided in the module shown in FIG. 8.

Modifications and variations such as would be apparent to a skilled addressee are deemed within the scope of the present invention. For example, the thermoelectric system of the present invention can be used in reverse mode to heat the inside of a container such as an incubator or food warmer.

We claim:

1. A thermoelectric system comprising at least one thermoelectric heat pump having a plurality of thermocouples disposed between first and second opposed thermally conductive outer faces, the first outer face being relatively cool and the second outer face being relatively hot in use, a first and second manifold defining a volume being attached to each opposed outer face of the thermoelectric heat pump, respectively, each manifold having an outer wall spaced from the thermoelectric heat pump and side walls abutting the respective first and second outer faces thereby defining an open face, the respective side walls and outer wall and outer face thereby defining the volume, each manifold having a fluid inlet and fluid outlet so that, in use, fluid flows through the manifolds wherein each outer face directly contacts the fluid flowing through the respective manifold, first and second heat exchangers, the first manifold being connected to the first heat exchanger, and the second manifold being connected to the second heat exchanger, and first and second fluid pumps being provided for circulating fluid as a liquid between the manifolds and the heat exchangers wherein the first manifold attached to the cold outer face is connected to the first fluid pump and the first heat exchanger and the second manifold attached to the hot outer face is connected to the second fluid pump and the second heat exchanger so that fluid from the first manifold attached to the cold outer face of the thermoelectric heat pump is circulated through the first heat exchanger by the first fluid pump and fluid from the second manifold attached to the hot outer face of the thermoelectric heat pump is circulated through the second heat exchanger by the second fluid pump.

2. A thermoelectric system according to claim 1, wherein the cool outer face faces in one direction and the hot outer face faces in an opposite direction.

3. A thermoelectric system according to claim 1, wherein there are a plurality of the thermoelectric heat pumps with attached manifolds and wherein the manifolds attached to the hot outer faces of the thermoelectric heat pumps are fluidly interconnected so that fluid flows through a plurality of manifolds and is subsequently circulated through the first heat exchange means by the first fluid pump means, and the manifolds attached to the cold outer faces of the thermoelectric heat pump are fluidly interconnected so that fluid flows through a plurality of manifolds and is subsequently circulated though the second heat exchange means by the second fluid pump means.

4. A thermoelectric system according to claim 1, wherein each manifold is formed of a molded plastics material and contains a plurality of partitions which engage a face of the thermoelectric heat pump with minimal surface area contact.

5. A thermoelectric system according to claim 1, wherein the electrical current to the thermoelectric heat pump can be reversed so that the heat pump can operate in the reverse direction to enable it to be used as both a cooling and heating system.

6. A thermoelectric system according to claim 1, wherein the or each manifold contains means defining an elongated passageway so as to enhance contact of fluid with the thermoelectric heat pump.

7. A thermoelectric system according to claim 6, wherein the or each manifold contains a plurality of generally parallel partitions which extend longitudinally from a wall of the manifold partially towards an opposed wall, adjacent partitions extending from opposite walls so as to define a labyrinthine fluid passageway which causes fluid to undergo a plurality of reversals of direction in passing from the inlet to the outlet.

8. A thermoelectric system according to claim 1, wherein a respective conduit extends from each inlet and outlet to a remote heat exchange means and the fluid pump means for the or each manifold is located in one of the conduits.

9. A thermoelectric system according to claim 8, wherein at least one heat exchange means contains a cooling fan.

10. A thermoelectric system according to claim 1, wherein as an electric current is applied across the or each thermoelectric heat pump, the or each fluid pump means is automatically energized.

11. A thermoelectric system according to claim 1, wherein the system is arranged to be cycled off when a desired condition is achieved.

12. A thermoelectric system according to claim 10, wherein the or each fluid pump means is automatically arranged to be de-energized when the system is cycled off.

13. A thermoelectric system according to claim 1, wherein the system is so arranged to act as a heat switch when the or each thermoelectric heat pump means is de-energized.

14. A thermoelectric system according to claim 1, wherein the or each thermoelectric heat pump means is electrically connected to be in series or parallel as desired.

15. A thermoelectric system comprising a plurality of thermoelectric heat pumps arranged side by side and each having first and second opposed outer faces, each first outer face being relatively cool and each second outer face being relatively hot in use, each cool outer face facing in one direction and each hot outer face facing in an opposite direction, a respective manifold attached to each opposed face of each thermoelectric heat pump, each manifold defining a volume being attached to the outer face of each thermoelectric heat pump, each manifold having an outer wall spaced from the thermoelectric heat pump and side walls abutting the respectively first and second outer faces thereby defining an open face, the respectively side walls and outer wall and outer face thereby defining the volume, each manifold having a fluid inlet and fluid outlet so that in use fluid flows through each manifold wherein each outer face directly contacts the fluid flowing through the respective manifold, the manifolds being connected to heat exchange means and fluid pump means being provided for circulating fluid between the manifolds at the fluid inlets and outlets and the heat exchange means, wherein the manifolds on the cold outer face are fluid connected to a first fluid pump means and a first heat exchange means and the manifolds on the hot outer faces are fluidly connected to a second fluid pump means and a second heat exchange means so that fluid from the manifolds attached to the cold outer faces of the thermoelectric heat pumps is circulated through the first heat exchange means by the first fluid pump and fluid from the manifolds attached to the hot outer faces of the thermoelecric heat pumps is circulated through the second heat exchange means by the second fluid pump.

16. A thermoelectric system comprising a plurality of thermoelectric heat pumps arranged side by side, at least two of the thermoelectric heat pumps having first and second opposed outer faces, each first outer face being relatively cool and each second outer face being relatively hot in use, each cool outer face facing in one direction and each hot outer face facing in an opposite direction, a respective manifold is attache d to each opposed face of the at least two thermoelectric heat pumps, each manifold defining a volume being attached to each opposed outer face of the at least two thermoelectric heat pumps, each manifold having an outer wall spaced from the thermoelectric heat pump and side walls abutting the respective first and second outer faces thereby defining an open face, the respective side walls and outer wall and outer face thereby defining the volume, each manifold having a fluid inlet and fluid outlet so that in use fluid flows through each manifold wherein each outer face directly contacts the fluid flowing through the respective manifold, the manifolds being connected to first and second heat exchangers and fluid pumps being provided for circulating fluid between the manifolds and the heat exchangers, wherein the manifolds on the hot outer faces are fluidly connected to the first fluid pump and first heat exchanger and the manifolds on the hot outer faces and fluidly connected to the second fluid pump and the second heat exchanger so that fluid from the manifolds attached to the cold outer faces of the thermoelectric heat pumps is circulated through the first heat exchanger by the first fluid pump and fluid from the manifolds attached to the hot outer faces of the thermoelectric heat pumps is circulated through the second heat exchanger by the second fluid pump.

17. A thermoelectric system according to claim 6, wherein the passageway has a cross section of 5 mm or less.

18. A thermoelectric system according to claim 17, wherein the manifold contains a plurality of partitions to define a plurality of channels of substantially singular direction of the passageway wherein there are at least eight channels to cause turbulence of the fluid.

19. A thermoelectric system according to claim 6, wherein the manifold contains a plurality of partitions to define a plurality of channels of substantially singular direction of the passageway wherein there are at least eight channels to cause turbulence of the fluid.

20. A thermoelectric system according to claim 6, wherein the manifold contains a plurality of partitions to define a plurality of channels of substantially singular direction to cause turbulence of the fluid, the thermoelectric heat pump and manifold having a cross section dimension and number of channels and cross section of channels being proportional to a thermoelectric heat pump ad manifold of cross section dimension of 40 mm×40 mm with at least eight channels.

21. A thermoelectric system according to claim 6, wherein the manifold contains a plurality of generally parallel partitions which extend longitudinally from a wall of the manifold towards an opposed wall, the partitions producing a zig-zag passageway.

22. A thermoelectric system according to claim 6, wherein the manifold contains a plurality of generally parallel partitions which extend longitudinally from a wall of the manifold towards and opposed wall, the partitions producing a spiral passageway.

23. A thermoelectric system according to claim 6, wherein the manifold contains a plurality of partitions which extend longitudinally from a wall of the manifold, the partitions producing a tortuous passageway.

24. A thermoelectric system according to claim 1, wherein a plurality of the thermoelectric heat pumps are arranged side by side.

* * * * *